Oct. 31, 1950 H. N. BEVERIDGE 2,528,206

WIDE DYNAMIC RANGE DETECTOR CIRCUIT

Filed Sept. 12, 1945

Inventor

HAROLD N. BEVERIDGE

By Ralph L. Chappell

Attorney

Patented Oct. 31, 1950

2,528,206

UNITED STATES PATENT OFFICE 2,528,206

WIDE DYNAMIC RANGE DETECTOR CIRCUIT

Harold N. Beveridge, Washington, D. C., assignor to Honorary Advisory Council for Scientific and Industrial Research, Ottawa, Ontario, Canada, a body-corporate of Canada Application September 12, 1945, Serial No. 615,896

3 Claims. (Cl. 250—20)

Figure 1:
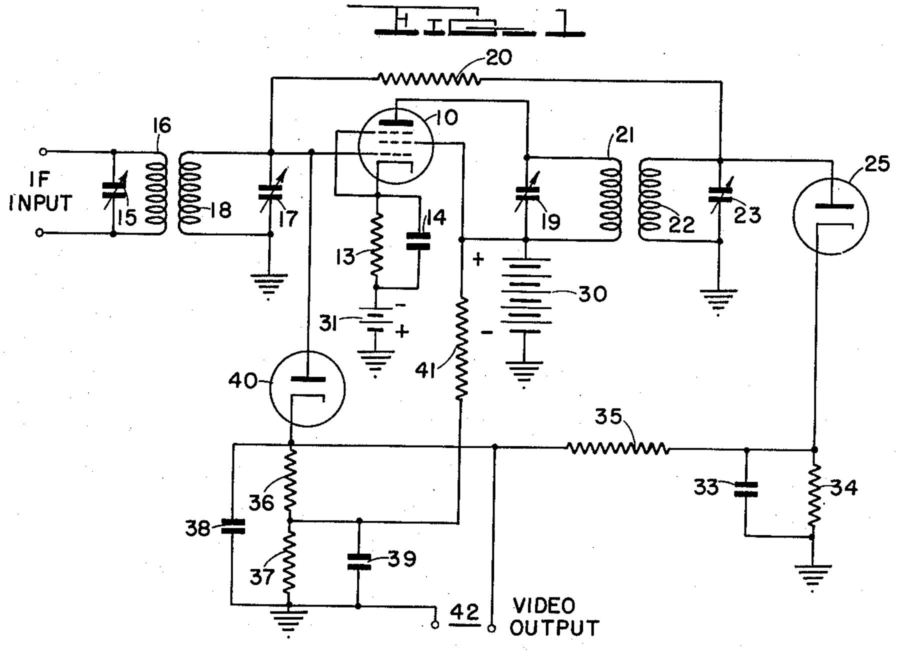

This invention relates to vacuum tube detectors, particularly to a detector having linear characteristics over a wide dynamic range.

In numerous important radio receiver applications a receiver having linear response to a wide range of signal strengths is desirable; that is, the receiver should in such applications reproduce with equal fidelity the modulation envelopes of signals whose amplitudes have a ratio as great as several hundred to one.

Wide dynamic range without manual adjustment is required for receivers in unattended service and in applications where weak signals must be detected even though superimposed on much stronger interfering signals. The requirement of wide dynamic range usually appears in company with the requirement of broad band-width.

To obtain a wide dynamic range in a receiver having a broad response-band is very difficult, the major obstacle being the detector circuit of the receiver. The most nearly linear of the rectifier devices available for use in detectors is the diode vacuum tube; and the diode gives approximately linear rectification only when the signal voltage fed to it is relatively large. This fact stems from the curved voltage-current characteristic possessed by all diodes in the region of zero anode volts; if the peak voltage of the signal fed to the diode is so small as to place the path of operation primarily in the curved part of the characteristic, substantial distortion of the signal modulation envelope results.

Standard receiver diodes give reasonably linear rectification on applied voltages of one-half volt or greater peak amplitude. Linear operation of a detector using a conventional circuit requires, therefore, that the detector be preceded by an amplifier of sufficient gain to raise the weakest desired signal to an amplitude of one-half volt. This can be done readily so long as the dynamic range required is not great. When, however, the receiver must perform linearly over a dynamic range of 50 db or more, a high-gain amplifier alone is not a simple solution. A receiver having a conventional detector circuit must, to attain linear dynamic range of 50 db, have an amplifier feeding the detector which will deliver undistorted signal voltage output up to more than one hundred fifty volts peak value. Such an amplifier designed for several megacycles over-all bandwidth would require tubes, power supply, and circuit components far larger in power rating than are normally employed in receivers and would be bulky and expensive.

This invention, employed as the detector component of a receiver, will overcome the difficulties encountered in the prior art relative to the design of wide-band receivers having extensive dynamic range. It is an object of this invention to provide a detector circuit which may be employed to extend the linear dynamic range of wide band receivers to 50 db or more.

Another object of this invention is to provide a detector circuit which will simultaneously rectify, with substantially linear characteristics, signal voltages ranging from a few hundredths of a volt to many volts amplitude.

Figure 2:
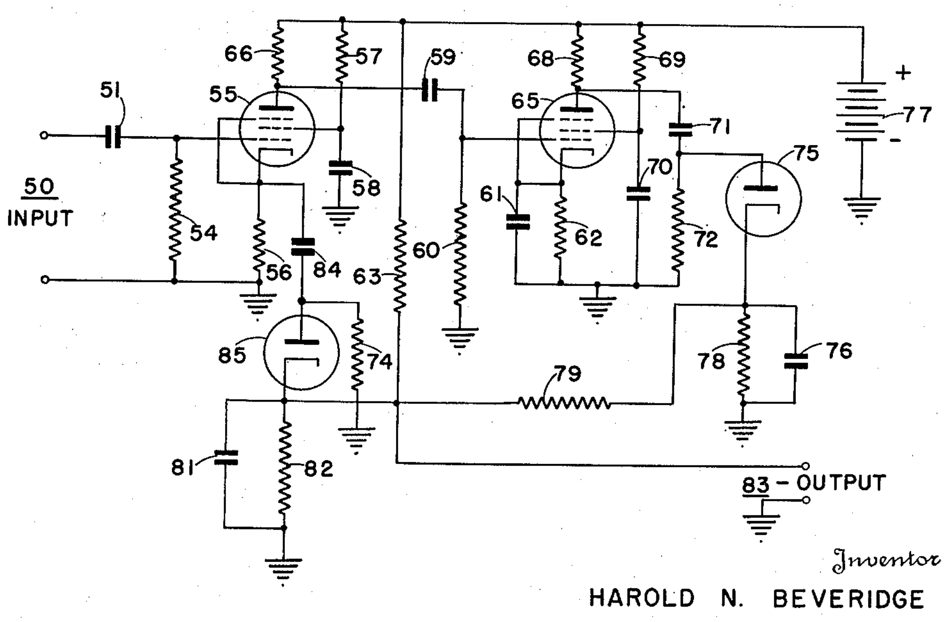

The invention will be described with reference to the appended drawings, of which Figure 1 is a schematic diagram of an embodiment of the invention designed to function as the detector of a superheterodyne receiver; and Figure 2 is a schematic diagram of an embodiment suitable for employment as an auxiliary detector in a receiver for the purpose of detecting weak signals despite interference from strong continuous wave signals.

Referring to Figure 1, modulated signal voltage from the output of the intermediate frequency amplifier of a superheterodyne receiver may be applied to the tank circuit comprising condenser 15 and coil 16 in parallel. Very closely coupled to tank circuit 15, 16 is another tank circuit, consisting of condenser 17 and coil 18 in parallel. These circuits are tuned to the intermediate frequency. One side of tank circuit 17, 18 is grounded; the other side is connected to the control grid of tube 10 and to the plate of diode tube 40.

The cathode of diode tube 40 is connected to ground through resistors 36 and 37 in series. Condenser 38, which is of a magnitude to by-pass intermediate frequency currents and offer a high impedance to modulation frequency currents, is connected between the cathode of diode 40 and ground. Condenser 39, which is a large capacitor offering low impedance to alternating currents of both the intermediate and modulation frequencies, is connected across resistor 37. High resistance 41 is connected between the junction of resistors 36 and 37 and the positive side of D. C. source 30. The negative side of D. C. source 30 is grounded.

The cathode and suppressor grid of tube 10 are connected together. Biasing resistor 13 and condenser 14 are connected in parallel between the cathode of tube 10 and the negative side of D. C. source 31. The positive side of source 31 is grounded. The screen grid of tube 10 is connected to the positive side of source 30. The plate of tube 10 is connected to the positive side of source 30 through a tank circuit comprising coil 21 and condenser 19 in parallel. Very closely coupled to coil 21 is coil 22, which is connected in parallel with condenser 23 to form another tank circuit. These circuits are tuned to the intermediate frequency. One side of coil 22 is grounded; the other side is connected to the plate of diode tube 25. A feedback resistor 20 is connected between the plate of diode 25 and the control grid of tube 10. The cathode of diode tube 25 is connected to ground through resistor 34 and condenser 33 in parallel. Condenser 33 is proportioned to bypass intermediate frequency currents and offer high impedance to modulation frequency currents. The cathode of diode tube 25 is connected to the cathode of diode tube 40 by resistor 35. Video voltage output terminals 42 are connected between the cathode of tube 40 and ground.

Resistor 41 and resistor 37 are so proportioned as to cause the bleeder current from source 30 to produce a D. C. voltage drop across resistor 37 equal to about one-half volt. This voltage drop serves as a positive bias on the cathode of diode tube 40, preventing the tube from conducting except when the voltage at its plate is one-half volt or more positive relative to ground.

The operation of the invention is as follows: Assume that a weak signal, of 0.05 volt carrier amplitude for example, is induced across coil 18. Such a small voltage has no effect on diode 40, because it does not raise the plate potential of diode 40 to a conducting level at any time. The signal is, however, applied to the grid of tube 10 and is amplified by that tube, which is connected to function as an amplifier to signals within the intermediate-frequency pass-band. The voltage of source 30 and the characteristics of tube 10 are so chosen as to cause tube 10 to have a moderate voltage amplification, perhaps twenty, but relatively limited signal-handling capability; that is, the amplifier has a voltage amplification of twenty on weak signals of less than a volt or two amplitude, but it saturates and functions as a limiter when the signal intensity is raised much above that level. For the signal being considered, the stage amplifies faithfully and produces across coil 22 an undistorted I. F. output voltage of 20 x 0.05 or one volt carrier amplitude. This voltage is applied to diode tube 25, diode 25 rectifies linearly, and a modulation frequency voltage appears across diode load resistor 34. The resistors 35 and 36 form a voltage divider which steps down the output voltage from diode 25 in the same proportion as the amplifier tube 10 raises the level of the signal voltage; i. e. in the case under consideration, the voltage from diode 25 across resistor 36 is one-twentieth the voltage across load resistor 34. (Resistor 37 is not part of this voltage divider because it is by-passed by condenser 39.) Resistor 36 is not shunted by incremental plate resistance in diode 40 owing to the half-volt D. C. bias thereon. The combined effect of tube 10 and diode 25 on a weak signal, therefore, is to produce at the output of the circuit a linearly detected voltage of the same amplitude that would have resulted had diode 40 been capable of operating linearly on the signal voltage across coil 18.

As the signal fed into the invention is increased in magnitude, the operation remains as described in the foregoing paragraph so long as the signal voltage amplitude is less than the cathode bias on diode 40. As the signal amplitude is made larger than the cathode bias on diode 40, that diode starts to conduct during the signal peaks. For a certain range of signal voltages, both detector channels function and the output voltage at terminals 42 is the resultant of the detected signal from diode 40 and the signal as routed through tube 10 and diode 25, since the two signal voltages are superimposed across resistor 36. When the signal grows to a value between one and two volts, so that diode 40 is operating linearly, tube 10 saturates and operates as a limiter, smoothing out the modulation envelope of the signal fed to it and producing a steady-amplitude output voltage. The result is that on strong signals the video voltage output of detector diode 25 drops to zero and the signal path through tube 10 and diode 25 becomes inoperative. For signals of large amplitude, diode 40 functions alone as a linear detector.

In summary: On very weak signals, the path through diode 40 is inoperative and the path through amplifier tube 10, diode 25, and voltage divider 35, 36 yields a linearly detected video output voltage. On very strong signals, the path through amplifier tube 10 and diode 25 is inoperative and diode 40 gives a linearly detected output voltage. For a narrow intermediate range of voltages both signal channels contribute to the net output voltage. The overall result is essentially linear detection over a very wide dynamic range.

The embodiment of the invention shown in Figure 2 is designed to solve a special problem which may be encountered in the reception of impulse type signals. In impulse communication and echo-ranging systems the desired signals consist of a radio frequency carrier having modulation consisting of short rectangular impulses. If in the reception of such signals interference is experienced from a strong continuous wave signal having a frequency near that of the desired impulse signals, special measures are necessary to effect reception of the impulse signals. If the ratio of amplitudes of the interfering and desired signals exceeds the linear dynamic range of the receiver, the detector output when the interfering signal is present will be steady D. C. and reception of the desired signal will be impossible. If, however, the receiver's response is linear even at the level of the intervening signal, the detector output will be D. C. when only the interfering C. W. signal is present, but when the desired impulse signal and the C. W. signal are being received together, the detector will deliver an A. C. voltage having a frequency equal to the difference between the frequency of the desired signal and the frequency of the interfering signal. If this A. C. voltage be rectified in an auxiliary detector following the usual detector stage, a video voltage conforming to the impulse envelope of the desired signal can be derived notwithstanding interference from the much stronger C. W. signal. The embodiment of the invention shown in Figure 2 is such an auxiliary detector.

An auxiliary detector designed to accomplish the result described in the preceding paragraph must, of course, pass normal video voltage without distortion; otherwise the receiver would work successfully when the desired signal was being interfered with but would fail if no interference were present. The circuit of Fig. 2 conforms to this requirement.

Referring to Figure 2, one of the input terminals 50 is grounded; the other is connected through condenser 51 to the control grid of tube 55. The control grid of tube 55 is returned to ground through resistor 54. The suppressor grid and the cathode of tube 55 are tied together and are connected to ground through cathode load resistor 56. The screen grid of tube 55 is by-passed to ground by condenser 58 and is connected to the positive side of D. C. source 77 through resistor 57. The plate of tube 55 is connected to the positive side of D. C. source 77 through plate load resistor 66. Resistances 56 and 66 are equal in magnitude. The cathode of tube 55 is connected to the plate of diode tube 85 through coupling condenser 84. Resistor 74 is connected between the plate of diode 85 and ground. The cathode of diode tube 85 is connected to ground through resistor 82 and condenser 81 in parallel. High resistance 63 is connected between the cathode of tube 85 and the positive side of D. C. source 77. The negative side of D. C. source 77 is grounded.

The plate of tube 55 is coupled to the control grid of tube 65 through condenser 59; resistor 60 is connected between the control grid of tube 65 and ground. The suppressor grid and cathode of tube 65 are tied together. Biasing resistor 62 and by-pass condenser 61 are connected in parallel between the cathode of tube 65 and ground. The screen grid of tube 65 is bypassed to ground by condenser 70 and is connected to the positive side of source 77 through resistor 69. The plate of tube 65 is connected to the positive side of source 77 through load resistor 68.

The plate of tube 65 is coupled to the plate of diode 75 by condenser 71; resistor 72 is connected between the plate of diode 75 and ground. The cathode of diode 75 is connected to ground through resistor 78 and condenser 76 in parallel. Resistor 79 is connected between the cathode of diode 75 and the cathode of diode 85. Output terminals 83 are connected between the cathode of diode 85 and ground.

The operation of this circuit is similar in principle to the operation of the embodiment of Figure 1. The input voltage is that derived from the output of the detector in the receiver proper. The A. C. component of the input voltage is applied to the grid of phase-splitting tube 55. A. C. voltages, identical in amplitude and waveform but opposite in instantaneous polarity, appear at the cathode and plate respectively of tube 55. The voltage at the cathode is applied to the diode detector circuit incorporating tube 85; the voltage at the plate is applied to the grid of amplifier tube 65, and thence to diode 75. A polarity inversion occurs in tube 65, so that the A. C. voltage applied to diode 75 from tube 65 has the same instantaneous polarity as the A. C. voltage applied to diode 85 by tube 55.

The cathode of diode 85 is given a small positive bias by voltage divider 63, 82, so that weak signals do not cause diode 85 to conduct, but are instead fed through amplifier tube 65 and applied to diode 75. As in the previously described embodiment, the amplifier circuit is designed to function as a limiter on large applied signals. Consequently the signal path through diode 75 functions on low level signals, the path through diode 85 functions on strong signals, and on intermediate level signals, the two paths function simultaneously just as in the embodiment of Figure 1. The phase-splitting tube 55 is required in this application to insure that the two signal channels will coordinate properly to retain and pass in the same polarity the video voltage fed in when no C. W. interference exists. Resistors 79 and 82 are so chosen as to cause their step-down action to exactly cancel the amplification of tube 65, thus obtaining linear rectification in diode 75 without distorting the relative signal amplitudes at the output terminals 83.

It will be understood that the embodiments of this invention shown and described herein are exemplary only, and that the scope of the invention is to be determined by reference to the appended claims.

What is claimed is:

1. A method of linearly rectifying signals having a wide range of amplitude variation comprising rectifying signals of large amplitude, amplifying signals of low amplitude, rectifying the low level signals as amplified, linearly attenuating them after rectification in the same proportion as they were amplified, mixing the rectified high level signals with the rectified low level signals as attenuated, and deriving an output from the combined rectified signals.

2. In combination, input means; means operative to apply to the input means a modulated alternating signal; a first rectifier circuit coupled to the input means comprising a first diode electron tube and a first load impedance; means operative to bias the first diode to block the first rectifier circuit to signals below a predetermined level of amplitude; an amplifier coupled to the input means operative to amplify only signals below a predetermined level of amplitude; a second rectifier circuit fed by the amplifier comprising a second diode electron tube and a second load impedance; means coupling the second load impedance to the first load impedance operative to impress across the first load impedance a fraction of the voltage across the second load impedance equal to the reciprocal of the amplification of the amplifier; and output means coupled to the first load impedance.

3. In combination, input means; means operative to apply to the input means a modulated alternating input signal; phase-splitting means, fed by the input means, having first and second outputs operative to produce at the first output a signal similar in waveform to the input signal and to produce at the second output a signal similar in waveform and amplitude but opposite in instantaneous polarity to the signal produced at the first output; a first rectifier circuit coupled to the first output of the phase-splitting means comprising a first diode electron tube and a first load impedance; means operative to bias the first diode to block the first rectifier circuit to signals below a predetermined level of amplitude; an amplifier coupled to the second output of the phase splitting means responsive only to signals below a predetermined level of amplitude and operative to amplify said signals and reverse the instantaneous polarity thereof; a second rectifier circuit fed by the amplifier comprising a second diode electron tube and a second load impedance; means coupling the second load impedance to the first load impedance operative to impress across the first load impedance a fraction of the voltage across the second load impedance equal to the reciprocal of the amplification of the amplifier; and output means coupled to the first load impedance.

HAROLD N. BEVERIDGE.

REFERENCES CITED

The following references are of record in the file of this patent:

UNITED STATES PATENTS

| Number | Name | Date |
|---|---|---|
| 1,401,644 | Rice | Dec. 27, 1921 |
| 1,477,017 | Sprague | Dec. 11, 1923 |
| 1,698,668 | Ballantine | Jan. 8, 1929 |
| 1,770,838 | Carlson | July 15, 1930 |
| 2,018,540 | Wheeler | Oct. 22, 1935 |
| 2,046,141 | Wilhelm | June 30, 1939 |